US012802887B2

(12) United States Patent
Iwai

(10) Patent No.: US 12,802,887 B2
(45) Date of Patent: Nov. 17, 2026

(54) MULTILAYER CERAMIC ELECTRONIC DEVICE, MANUFACTURING METHOD OF THE SAME, AND CIRCUIT BOARD

(71) Applicant: TAIYO YUDEN CO., LTD., Tokyo (JP)

(72) Inventor: Daisuke Iwai, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 121 days.

(21) Appl. No.: 18/806,106

(22) Filed: Aug. 15, 2024

(65) Prior Publication Data

US 2024/0412924 A1 Dec. 12, 2024

Related U.S. Application Data

(63) Continuation of application No. PCT/JP2023/024974, filed on Jul. 5, 2023.

(30) Foreign Application Priority Data

Sep. 5, 2022 (JP) ................................ 2022-140865

(51) Int. Cl.
*H01G 4/30* (2006.01)
*H01G 4/224* (2006.01)
(Continued)

(52) U.S. Cl.
CPC ............... *H01G 4/30* (2013.01); *H01G 4/224* (2013.01); *H01G 4/232* (2013.01); *H05K 1/181* (2013.01); *H05K 2201/10015* (2013.01)

(58) Field of Classification Search
CPC .......... H01G 4/30; H01G 4/224; H01G 4/232; H01G 4/12; H01G 2/06; H05K 1/181; H05K 2201/10015
See application file for complete search history.

(56) References Cited

U.S. PATENT DOCUMENTS

| | | | | |
|---|---|---|---|---|
| 11,049,652 | B2 * | 6/2021 | Mizuno | H01G 4/012 |
| 11,081,281 | B2 * | 8/2021 | Lee | H01G 4/30 |
| 11,961,680 | B2 * | 4/2024 | Shimada | H01G 4/30 |
| 11,990,283 | B2 * | 5/2024 | Motomiya | H01G 4/012 |
| 2017/0040112 | A1 * | 2/2017 | Tanaka | H01G 4/232 |
| 2017/0339792 | A1 * | 11/2017 | Hattori | H01G 2/065 |

(Continued)

FOREIGN PATENT DOCUMENTS

| | | |
|---|---|---|
| JP | H 02-70402 U | 5/1990 |
| JP | H 09-260204 A | 10/1997 |

(Continued)

OTHER PUBLICATIONS

Translation of JP '771 (Year: 2009).*

(Continued)

*Primary Examiner* — Dion R. Ferguson
(74) *Attorney, Agent, or Firm* — Stein IP, LLC

(57) ABSTRACT

A multilayer ceramic electronic device includes a multilayer structure in which each of a plurality of internal electrode layers and each of a plurality of dielectric layers are alternately stacked, and a pair of external electrodes that respectively cover a pair of facing end surfaces of the multilayer structure, and are alternately connected to the plurality of internal electrode layers along a stacking direction of the multilayer structure. Among four surfaces of the multilayer structure excluding the pair of end surfaces, a surface roughness of at least one of a pair of first surfaces that face each other in the stacking direction is smaller than a surface roughness of at least one of a pair of second surfaces that face each other in an orthogonal direction approximately orthogonal to a facing direction in which the pair of end surfaces face each other and the stacking directions.

16 Claims, 11 Drawing Sheets

(51) Int. Cl.
*H01G 4/232* (2006.01)
*H05K 1/181* (2026.01)

(56) References Cited

U.S. PATENT DOCUMENTS

| | | | | |
|---|---|---|---|---|
| 2018/0075970 | A1 | 3/2018 | Sato et al. | H01G 4/12 |
| 2020/0066455 | A1* | 2/2020 | Sato | H01G 4/30 |
| 2022/0020534 | A1* | 1/2022 | Fukuda | H01G 4/224 |
| 2022/0084750 | A1 | 3/2022 | Miyauchi | H01G 4/232 |
| 2022/0172900 | A1* | 6/2022 | Shimada | H01G 4/30 |
| 2022/0181088 | A1* | 6/2022 | Motomiya | H01G 4/224 |
| 2024/0412924 | A1* | 12/2024 | Iwai | H01G 4/12 |

FOREIGN PATENT DOCUMENTS

| | | | | |
|---|---|---|---|---|
| JP | 2001-332437 | A | 11/2001 | |
| JP | 2009176771 | A * | 8/2009 | |
| JP | 2014-187142 | A | 10/2014 | |
| JP | 2016-034035 | A | 3/2016 | |
| JP | 2016-092289 | A | 5/2016 | |
| JP | 2018-046131 | A | 3/2018 | |
| JP | 2022-049987 | A | 3/2022 | |
| JP | 2023071558 | A * | 5/2023 | H01G 4/30 |
| WO | WO-2022168446 | A1 * | 8/2022 | H01B 5/16 |

OTHER PUBLICATIONS

International Search Report dated Sep. 19, 2023 issued in PCT Application No. PCT/JP2023/024974.

Written Opinion of the International Searching Authority dated Sep. 19, 2023 issued in PCT Application No. PCT/JP2023/024974.

English translation of the Written Opinion of International Patent Authority, issued on Mar. 20, 2025 in counterpart International Application No. PCT/JP2023/024974.

* cited by examiner

MULTILAYER CERAMIC ELECTRONIC DEVICE, MANUFACTURING METHOD OF THE SAME, AND CIRCUIT BOARD

CROSS-REFERENCE TO RELATED APPLICATION

This application is a continuation application of International Application No. PCT/JP2023/024974 filed on Jul. 5, 2023, which claims the benefit of Japanese Application No. 2022-140865, filed on Sep. 5, 2022, in the Japanese Patent Office, the entire contents of which are incorporated herein by reference.

FIELD

A certain aspect of the present disclosure relates to a multilayer ceramic electronic device, a manufacturing method of the ceramic electronic device, and a circuit board.

BACKGROUND

There is a technology that covers a multilayer ceramic capacitor mounted on a circuit board with a mold resin to, for example, relieve stress caused by bending the circuit board and improve moisture resistance (see Japanese Patent Application Publication No. 2022-49987 and Japanese Patent Application Publication No. 2014-187142). The mold resin is poured from above the circuit board onto the top surface of the mounted multilayer ceramic capacitor, flows over the surface of the multilayer ceramic capacitor to cover the entire surface, and is then heated and thermally hardened.

SUMMARY OF THE INVENTION

According to an aspect of the embodiments, there is provided a multilayer ceramic electronic device including: a multilayer structure having a substantially rectangular parallelepiped shape in which each of a plurality of internal electrode layers and each of a plurality of dielectric layers are alternately stacked; and a pair of external electrodes that respectively cover a pair of facing end surfaces of the multilayer structure, and are alternately connected to the plurality of internal electrode layers along a stacking direction of the multilayer structure, wherein, among four surfaces of the multilayer structure excluding the pair of end surfaces, a surface roughness of at least one of a pair of first surfaces that face each other in the stacking direction is smaller than a surface roughness of at least one of a pair of second surfaces that face each other in an orthogonal direction approximately orthogonal to a facing direction in which the pair of end surfaces face each other and the stacking directions.

According to another aspect of the embodiments, there is provided a manufacturing method of a multilayer ceramic electronic device including: stacking a plurality of green sheets, each having an internal electrode layer formed on a surface thereof; crimping the plurality of green sheets in a stacking direction with a pressing member; after the crimping, cutting the plurality of green sheets along the stacking direction with a blade so as to divide the plurality of green sheets into a plurality of multilayer structures having a substantially rectangular parallelepiped shape; and forming a pair of external electrodes so as to cover a pair of facing end surfaces of the multilayer structure and so as to be alternately connected to the internal electrode layers along the stacking direction, wherein, in the crimping, among four surfaces of the multilayer structure excluding the pair of end surfaces, a surface roughness of a surface of the pressing member contacting at least one of a pair of first surfaces facing each other in the stacking direction is set so that a surface roughness of at least one of the pair of first surfaces is smaller than a surface roughness of at least one of a pair of second surfaces adjacent to the pair of first surfaces.

According to another aspect of the embodiments, there is provided a manufacturing method of a multilayer ceramic electronic device including: stacking a plurality of green sheets, each having an internal electrode layer formed on a surface thereof; crimping the plurality of green sheets in a stacking direction with a pressing member; after the crimping, cutting the plurality of green sheets along the stacking direction with a blade so as to divide the plurality of green sheets into a plurality of multilayer structures having a substantially rectangular parallelepiped shape; and forming a pair of external electrodes so as to cover a pair of facing end surfaces of the multilayer structure and so as to be alternately connected to the internal electrode layers along the stacking direction, wherein, in the cutting, among four surfaces of the multilayer structure excluding the pair of end surfaces, a cutting edge of the blade is formed with irregularities so that a surface roughness of at least one of a pair of first surfaces facing each other in the stacking direction is smaller than a surface roughness of at least one of a pair of second surfaces adjacent to the pair of first surfaces.

According to another aspect of the embodiments, there is provided a multilayer ceramic electronic device that is covered with a mold material and is mounted on the circuit board, wherein the multilayer ceramic capacitor includes: a multilayer structure having a substantially rectangular parallelepiped shape in which each of a plurality of internal electrode layers and each of a plurality of dielectric layers are alternately stacked; and a pair of external electrodes that respectively cover a pair of facing end surfaces of the multilayer structure, and are alternately connected to the plurality of internal electrode layers along a stacking direction of the multilayer structure, wherein, among four surfaces of the multilayer structure excluding the pair of end surfaces, a surface roughness of a first surface of the multilayer structure facing the circuit board is smaller than a surface roughness of at least one of a pair of second surfaces adjacent to the first surface.

DETAILED DESCRIPTION

However, since there is only a small gap between the mounting surface of the lower part of the multilayer ceramic capacitor and the surface of the circuit board, it is difficult for the mold resin to flow in, and there is a risk of voids being generated in the mold resin in the gap. If these voids are present, for example, moisture may accumulate in the voids, reducing moisture resistance and thus the reliability of the mold may decrease.

Figure 1:
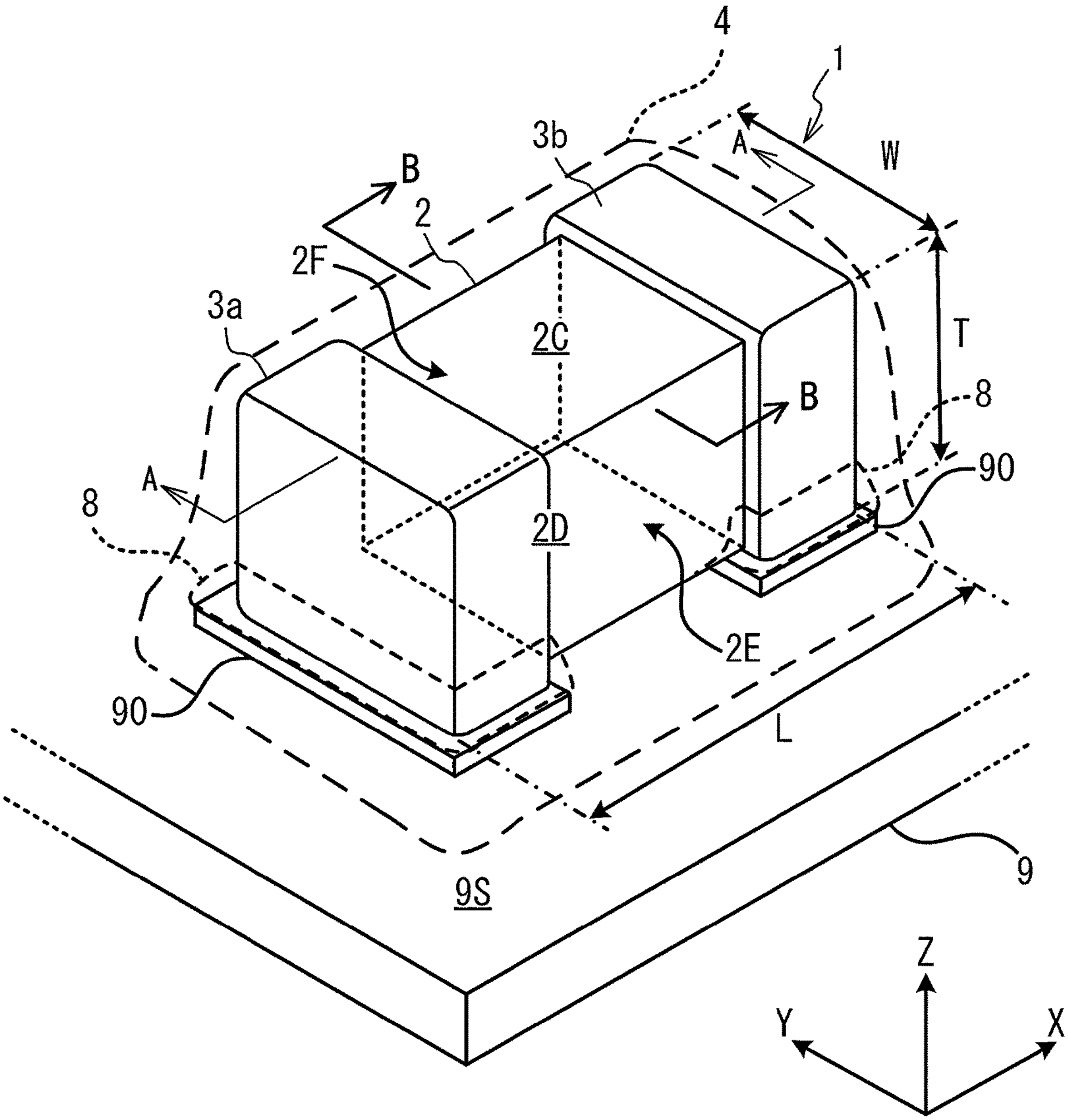
FIG. 1 is a perspective view illustrating an example of a multilayer ceramic capacitor mounted on a circuit board.
Figure 2:
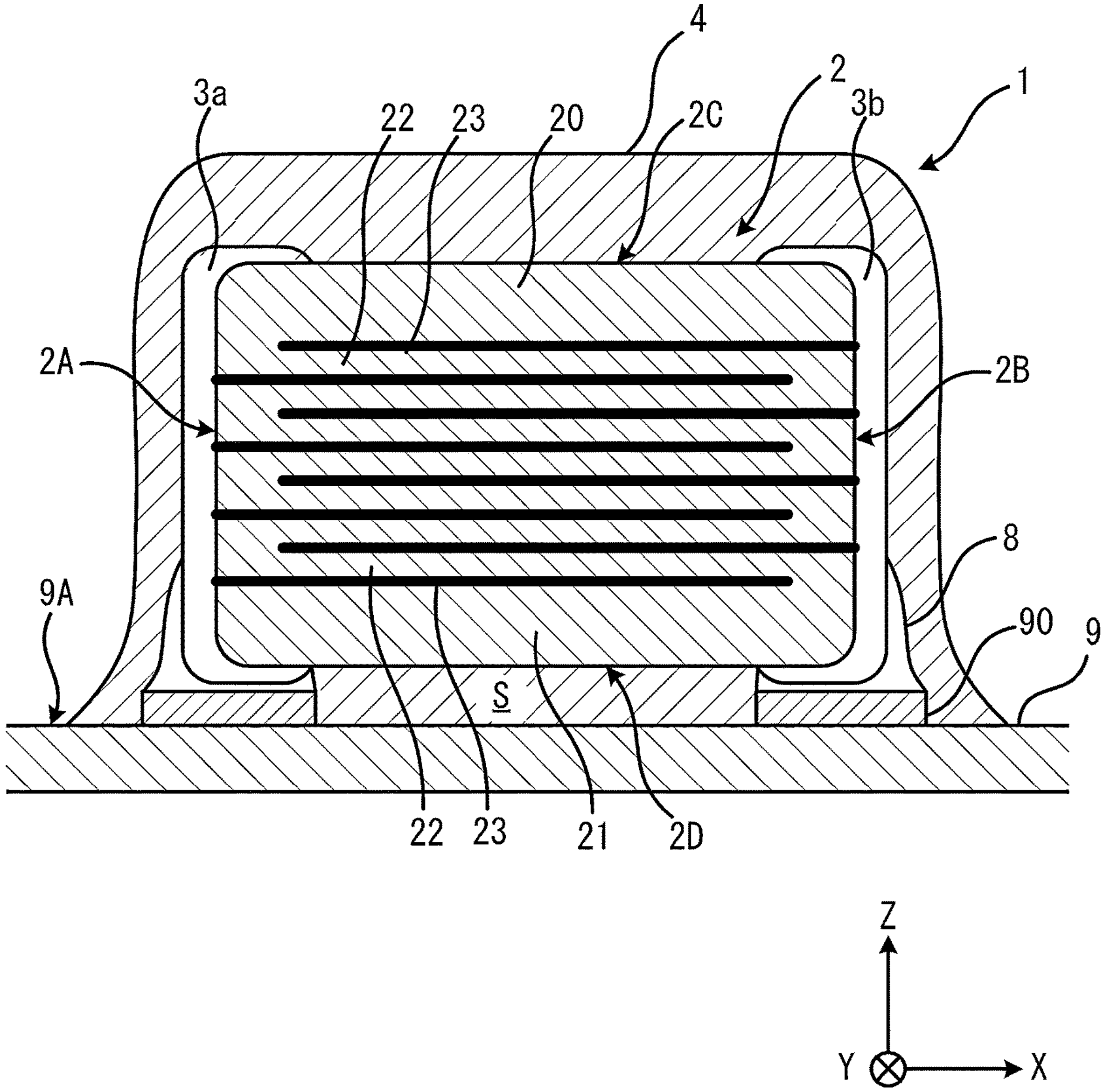
FIG. 2 is a cross-sectional view of a multilayer ceramic capacitor taken along a line A-A in FIG. 1.
Figure 3:
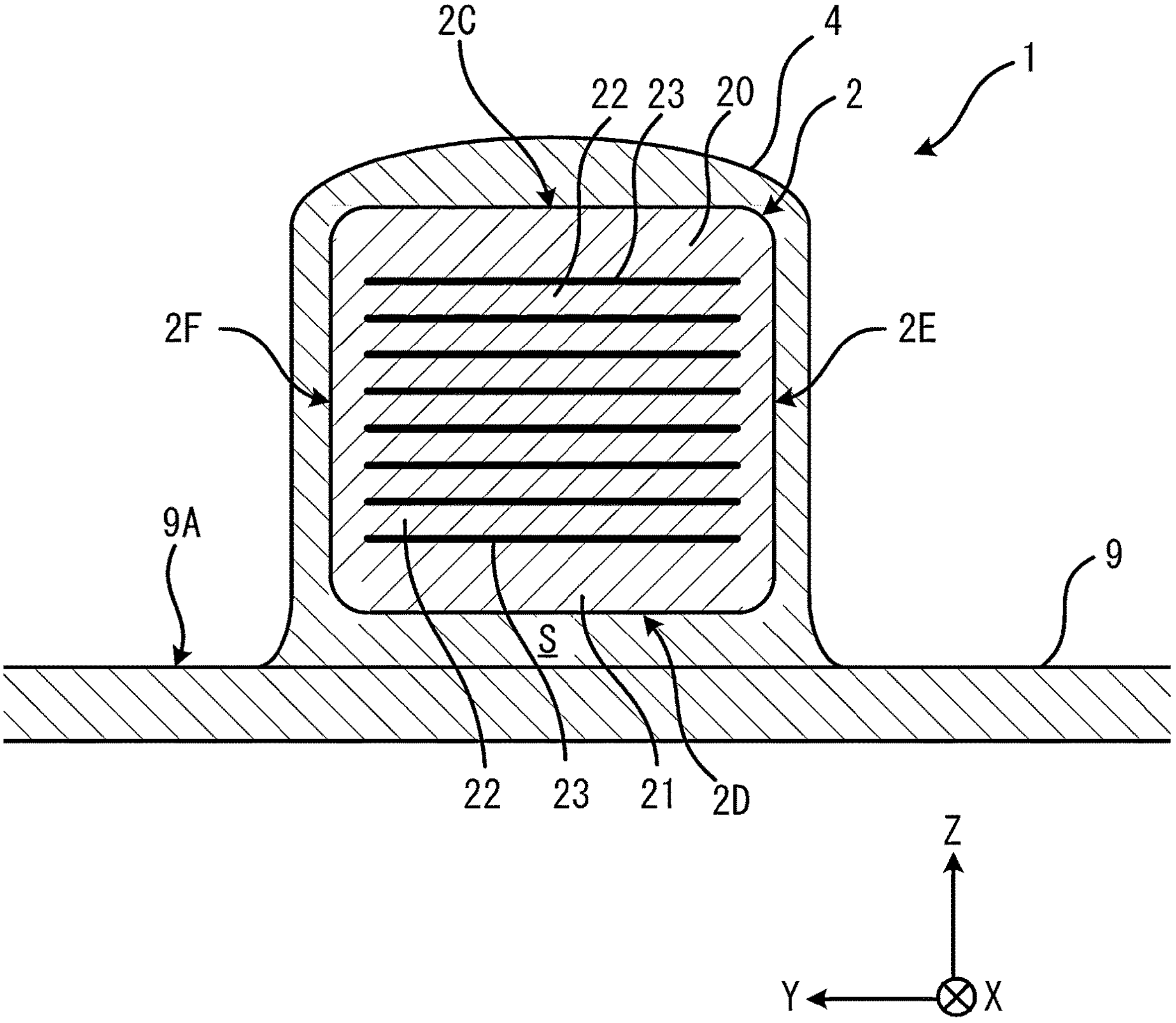
FIG. 3 is a cross-sectional view of a multilayer ceramic capacitor taken along a line B-B in FIG. 1.

FIG. 1 is a perspective view illustrating an example of a multilayer ceramic capacitor 1 mounted on a circuit board 9. FIG. 2 is a cross-sectional view of the multilayer ceramic capacitor 1 taken along a line A-A in FIG. 1. FIG. 3 is a cross-sectional view of the multilayer ceramic capacitor 1 taken along a line B-B in FIG. 1.

The multilayer ceramic capacitor 1 is an example of a multilayer ceramic electronic device. The multilayer ceramic capacitor 1 has a multilayer chip 2 having a substantially rectangular parallelepiped shape, and the external electrodes 3*a* and 3*b* provided on a pair of end surfaces 2A and 2B of the multilayer chip 2 which face each other. The external electrodes 3*a* and 3*b* are respectively joined to a pair of pads 90 on a board surface 9S of the circuit board 9 by a solder 8 (see dotted line). The pads 90 are electrodes provided on the board surface 9S. The multilayer chip 2 is an example of a multilayer structure.

The multilayer ceramic capacitor 1 is mounted on the circuit board 9 while covered with a mold resin 4 (see dotted line). As a result, for example, the multilayer ceramic capacitor 1 is able to reduce stress caused by bending the circuit board 9 and has improved moisture resistance. The mold resin 4 is an example of a molding material.

FIG. 1 to FIG. 3 illustrate the mutually orthogonal X, Y, and Z directions. The X direction is the length (L) direction of the multilayer ceramic capacitor 1 and corresponds to the direction in which the pair of end surfaces 2A and 2B face each other. The Y direction is the width (W) direction of the multilayer ceramic capacitor 1 and corresponds to the direction in which the pair of side surfaces 2E and 2F face each other. The Z direction is the height (H) direction of the multilayer ceramic capacitor 1 and corresponds to the stacking direction of the multilayer ceramic capacitor 1. The upper and lower surfaces of the multilayer chip 2 in the stacking direction are referred to as an upper surface 2C and a lower surface 2D. The length direction of the multilayer ceramic capacitor 1 is an example of the facing direction.

The multilayer chip 2 has a multilayer structure in which dielectric layers 22 containing a ceramic material that functions as a dielectric and internal electrode layers 23 are alternately stacked.

The internal electrode layer 23 is mainly composed of a base metal such as nickel (Ni), copper (Cu), or tin (Sn). The internal electrode layer 23 may be composed of a noble metal such as platinum (Pt), palladium (Pd), silver (Ag), or gold (Au) or alloy including one or more of them.

A main component of the dielectric layer 22 is a ceramic material having a perovskite structure expressed by a general formula $ABO_3$. The perovskite structure includes $ABO_{3-\alpha}$ having an off-stoichiometric composition. For example, the ceramic material is such as $BaTiO_3$ (barium titanate), $CaZrO_3$ (calcium zirconate), $CaTiO_3$ (calcium titanate), $SrTiO_3$ (strontium titanate), $MgTiO_3$ (magnesium titanate), $Ba_{1-x-y}Ca_xSr_yTi_{1-z}Zr_2O_3$ ($0 \leq x \leq 1$, $0 \leq y \leq 1$, $0 \leq z \leq 1$) having a perovskite structure. $Ba_{1-x-y}Ca_xSr_yTi_{1-z}Zr_zO_3$ may be barium strontium titanate, barium calcium titanate, barium zirconate, barium titanate zirconate, calcium titanate zirconate, barium calcium titanate zirconate or the like.

The external electrodes 3*a* and 3*b* cover the opposing end surfaces 2A and 2B of the multilayer chip 2. The external electrodes 3*a* and 3*b* extend to the upper surface 2C, the lower surface 2D, and the two side surfaces 2E and 2F. However, the external electrodes 3*a* and 3*b* are spaced apart from each other on the upper surface 2C, the lower surface 2D, and the two side surfaces 2E and 2F.

The external electrodes 3*a* and 3*b* are mainly composed of metals such as Cu, Ni, Al (aluminum), Zn (zinc), Au (gold), or Sn (tin), and may contain two or more of these metals or alloys (for example, an alloy of Cu and Ni), and may further contain ceramics such as glass components for densifying the external electrodes 3*a* and 3*b* and co-materials for controlling the sinterability of the external electrodes 3*a* and 3*b*. The glass component is an oxide of Ba (barium), Sr (strontium), Ca (calcium), Zn (zinc), Al, Si (silicon), B (boron), or the like. The common material is, for example, a ceramic component mainly composed of the same material as the main component of the dielectric layer 22. The external electrodes 3*a* and 3*b* may be formed with a plated layer mainly composed of base metals such as Ni, Cu, or Sn. Furthermore, a layer of conductive resin such as epoxy resin or urethane resin may be formed on the surface of the external electrodes 3*a* and 3*b*. In this case, for example, the external electrodes 3*a* and 3*b* may have a layer structure including a base electrode layer mainly composed of Cu that connects to the internal electrodes, a conductive resin layer formed to cover the base electrode layer, and a Ni-plated layer and a Sn-platted layer formed on the conductive resin layer.

As can be seen from FIG. 2, the edges of the internal electrode layers 23 in the length direction are alternately exposed to the end surface 2A of the multilayer chip 2 on which the external electrode 3*a* is provided and the end surface 2B of the multilayer chip 2 on which the external electrode 3*b* is provided. As a result, the internal electrode layers 23 are alternately conductive to the external electrode 3*a* and the external electrode 3*b* in the stacking direction. In other words, the external electrodes 3*a* and 3*b* on the end surfaces 2A and 2B are alternately connected to the internal electrode layers 23 along the stacking direction.

The upper portion and the lower portion of the multilayer chip 2 in the stacking direction are covered by cover layers 20 and 21, respectively. The cover layers 20 and 21 form the upper surface 2C and the lower surface 2D of the multilayer chip 2, respectively. The cover layers 20 and 21 are mainly made of a ceramic material, and are formed from the same main component material as the dielectric layer 22.

The size of the multilayer ceramic capacitor 1 differs between the shorter type and taller type. In the shorter type multilayer ceramic capacitor 1, the height T is the shortest among the height T, length L, and width W of the multilayer chip 2. In other words, the size relationship of the shorter type multilayer ceramic capacitor 1 is L>W>T or W>L>T.

The length L, the width W, and the height T of the shorter multilayer ceramic capacitor 1 are, for example, 0.6 mm, 0.3 mm, and 0.20 mm, or 1.0 mm, 0.5 mm, and 0.3 mm, or 3.2 mm, 1.6 mm, and 1.2 mm, or 3.2 mm, 2.5 mm, and 1.6 mm, or 4.5 mm, 3.2 mm, and 2.5 mm, but are not limited to these sizes. The numerical values given as sizes include typical manufacturing tolerances and are not limited to the above numerical values.

On the other hand, the taller multilayer ceramic capacitor 1 has a height T of the multilayer chip 2 that is longer than its width (W). The size of the taller type multilayer ceramic capacitor 1 satisfies the relationship L>T>W or the relationship T>L≥W. The taller type multilayer ceramic capacitor 1 generally has a greater number of the internal electrode layers 23 than the shorter type multilayer ceramic capacitor 1, and can achieve a larger electrostatic capacity.

The length L, the width W, and the height T of the taller type multilayer ceramic capacitor 1 are, for example, 0.6 mm, 0.3 mm, and 0.40 mm, or 1.0 mm, 0.5 mm, and 0.7 mm, or 3.2 mm, 1.6 mm, and 1.8 mm, or 3.2 mm, 2.5 mm, and 3.6 mm, or 4.5 mm, 3.2 mm, and 4.5 mm, but are not limited to these sizes. The numerical values given as sizes include typical manufacturing tolerances and are not limited to the above numerical values.

After the multilayer ceramic capacitor 1 is mounted on the circuit board 9 by a reflow process, the entire outer surface of the multilayer ceramic capacitor 1 is covered with the mold resin 4 poured from a dispenser above. The viscosity of the mold resin 4 is, for example, 6700 (Pa·s). The circuit board 9 is then heated for 8 to 10 minutes in a batch furnace at 130 to 150 (° C.) to harden the mold resin 4.

However, since there is only a small gap S (for example, 20 μm) between the lower surface 2D, which is the mounting surface of the multilayer ceramic capacitor 1, and the board surface 9S of the circuit board 9, it is difficult for the mold resin 4 to flow in, and there is a risk of a void forming in the mold resin 4 in the gap S. If this void exists, for example, moisture may accumulate in the void, reducing the moisture resistance, and thus reducing the reliability of the mold.

Therefore, the surface roughness Ra of the side surfaces 2E and 2F and the lower surface 2D of the multilayer chip 2 is set so that the mold resin 4 can easily flow into the gap S. Specifically, the multilayer ceramic capacitor 1 is formed so that the surface roughness Ra of the upper surface 2C and the lower surface 2D is smaller than the surface roughness Ra of the side surfaces 2E and 2F so that the wettability of the mold resin 4 on the lower surface 2D is greater than that on the side surfaces 2E and 2F. Here, the surface roughness Ra is specified in "JIS (Japan Industrial Standards) B 0601 (1994)". The upper surface 2C and the lower surface 2D are an example of a pair of the first surfaces that face each other, and the side surfaces 2E and 2F are an example of a pair of second surfaces that are adjacent to the upper surface 2C and the lower surface 2D. The flow of the mold resin 4 will be described in detail below.

Figure 4:
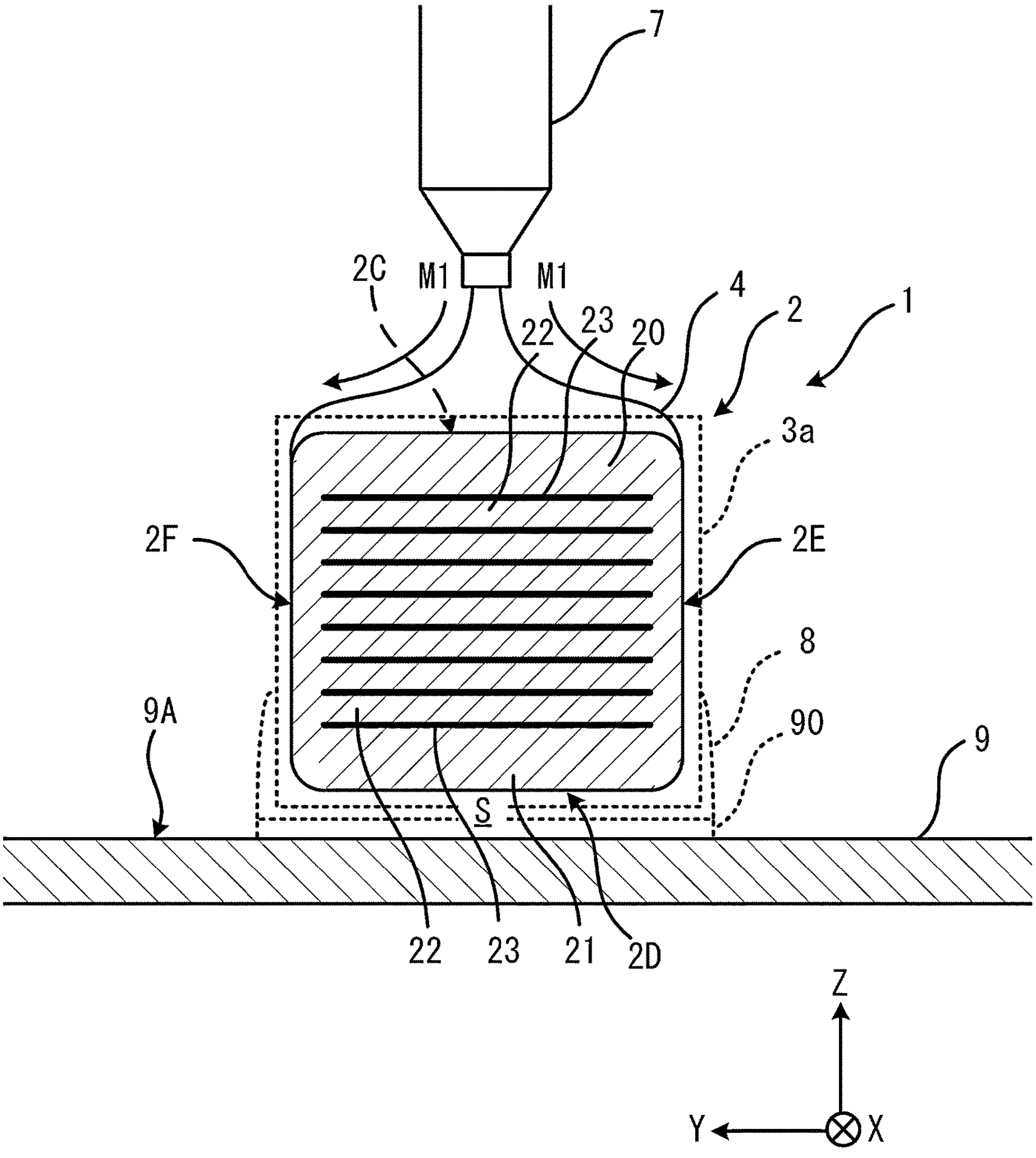
FIG. 4 is a cross-sectional view illustrating an example of a state in which a mold resin flows over an upper surface during a molding process of a multilayer ceramic capacitor.

(Molding process) FIG. 4 is a cross-sectional view illustrating an example of the state in which the mold resin 4 flows over the upper surface 2C during the molding process of the multilayer ceramic capacitor 1. In FIG. 4, the same components as those in FIG. 3 are given the same reference numerals, and their description will be omitted. In FIG. 4 to FIG. 8, the external electrode 3*a*, the solder 8, and the pad 90 are indicated by dotted lines.

A dispenser 7 that dispenses the mold resin 4 is disposed above the multilayer ceramic capacitor 1 so that the outlet of the mold resin 4 faces the upper surface 2C. The mold resin 4 dispensed from the dispenser 7 spreads over the upper surface 2C as indicated by the reference symbol M1. At this time, the smaller the surface roughness Ra of the upper surface 2C is, the higher the wettability and the easier it is for the mold resin 4 to flow over the upper surface 2C. Therefore, the multilayer chip 2 may be formed so that the surface roughness Ra of the upper surface 2C is smaller than the surface roughness Ra of both of the side surfaces 2E and 2F. This allows the mold resin 4 to flow smoothly from the upper surface 2C to both of the side surfaces 2E and 2F.

Figure 5:
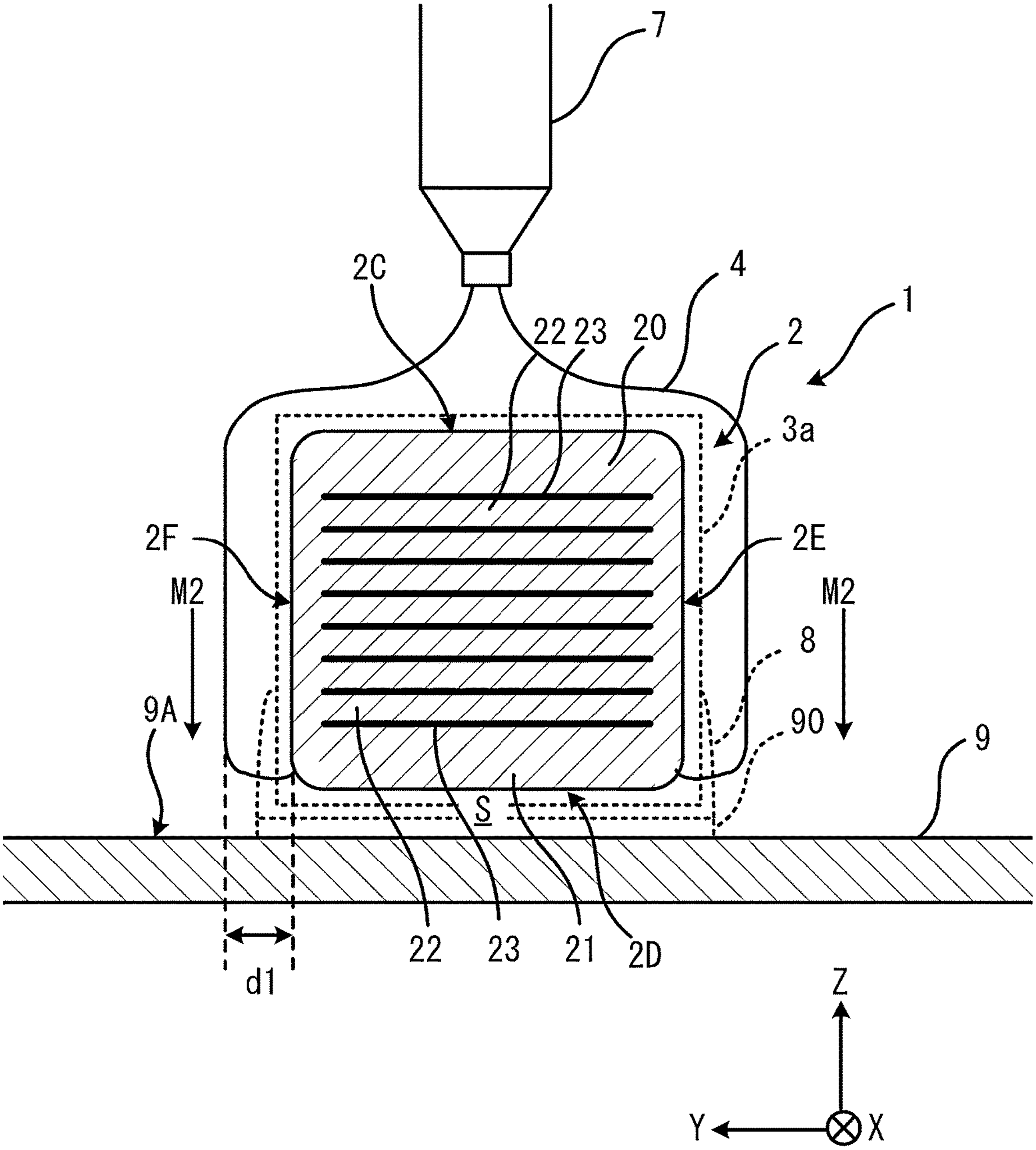
FIG. 5 is a cross-sectional view illustrating an example of a state in which a mold resin flows on side surfaces during a molding process of a multilayer ceramic capacitor.

FIG. 5 is a cross-sectional view illustrating an example of the state in which the mold resin 4 flows on the side surfaces 2E and 2F during the molding process of the multilayer ceramic capacitor 1. In FIG. 5, the same reference numerals are used for the components common to FIG. 3, and their description will be omitted.

After the mold resin 4 spreads on the upper surface 2C, the mold resin 4 flows vertically downward due to gravity on both of the side surfaces 2E and 2F adjacent to the upper surface 2C, as illustrated by reference numeral M2. At this time, the larger the surface roughness Ra of both of the side surfaces 2E and 2F is, the higher the surface resistance to the mold resin 4 is. This reduces the wettability of the side surfaces 2E and 2F, making it difficult for the mold resin 4 to flow on the side surfaces 2E and 2F. Therefore, the mold resin 4 that flows from the dispenser 7 along the upper surface 2C flows slowly and is likely to accumulate on the side surfaces 2E and 2F. Here, the thickness of the mold resin 4 on the side surfaces 2E and 2F in the Y direction is d1 (μm).

Figure 6:
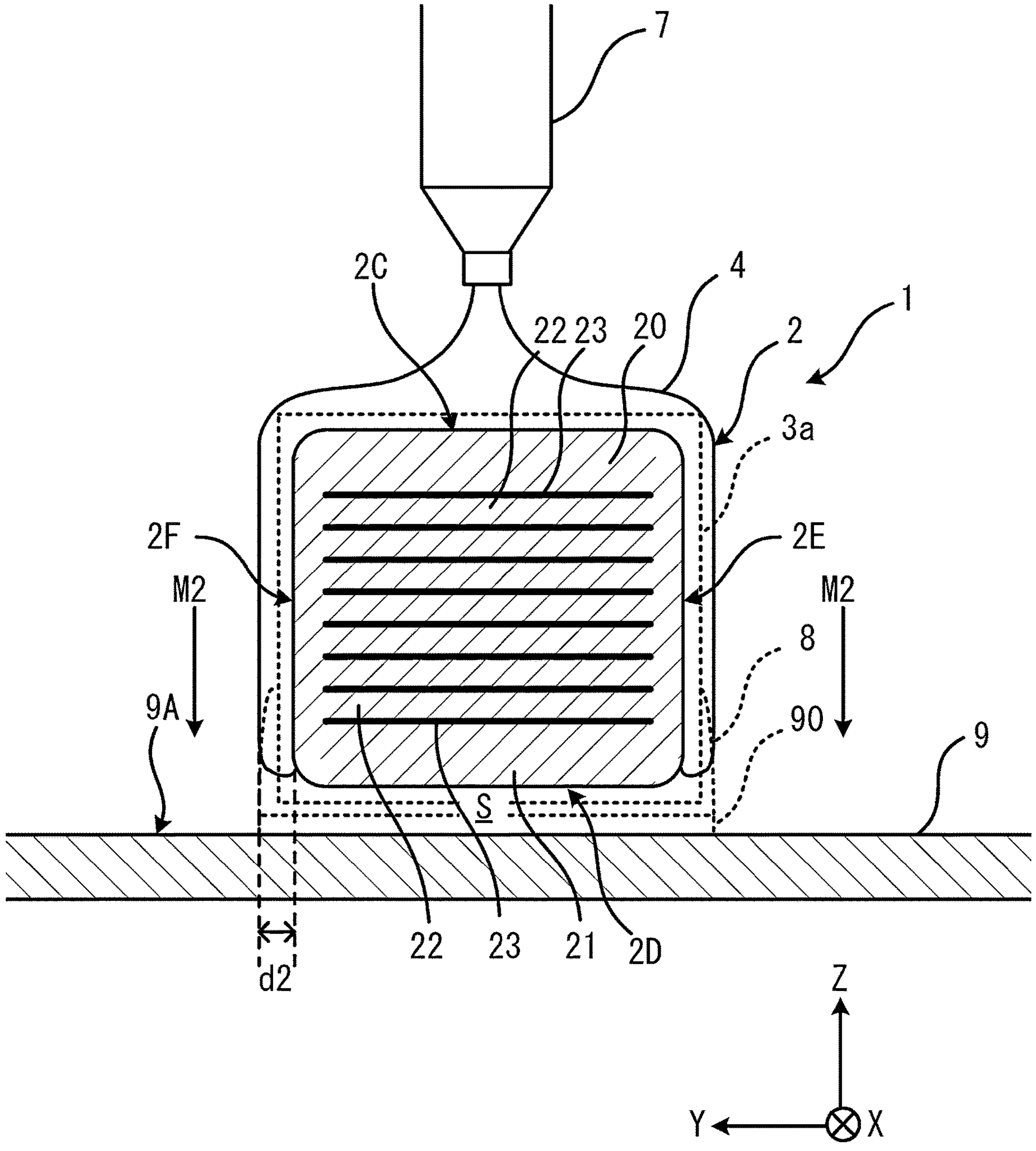
FIG. 6 is a cross-sectional view illustrating another example of a state in which a mold resin flows on side surfaces during a molding process of a multilayer ceramic capacitor.

FIG. 6 is a cross-sectional view illustrating another example of the state in which the mold resin 4 flows on the side surfaces 2E and 2F during the molding process of the multilayer ceramic capacitor 1. In FIG. 6, the same components as in FIG. 5 are given the same reference numerals, and their description is omitted.

In this example, the surface roughness Ra of both of the side surfaces 2E and 2F is smaller than that of the example in FIG. 5, so that the surface resistance to the mold resin 4 is smaller. This increases the wettability of the side surfaces 2E and 2F, and the mold resin 4 is more likely to flow on the side surfaces 2E and 2F. Therefore, the mold resin 4 flowing from the dispenser 7 along the upper surface 2C flows faster than in the case of FIG. 5, and is less likely to accumulate on the side surfaces 2E and 2F. Here, if the thickness of the mold resin 4 on the side surfaces 2E and 2F in the Y direction is d2 (μm), the thickness d2 is thinner than the thickness d1 in the example in FIG. 5.

In this manner, the thicknesses d1 and d2 of the mold resin 4 flowing along the side surfaces 2E and 2F depend on the surface roughness Ra. When the thickness d1 of the mold resin 4 is thick as illustrated in FIG. 5, the pressure at which the mold resin 4 flows into the gap S between the lower surface 2D and the board surface 9S of the circuit board 9 is higher than that when the thickness d2 of the mold resin 4 is thin as illustrated in FIG. 6. For this reason, when the thickness d1 of the mold resin 4 is thick, the mold resin 4 can easily flow into the gap S.

Figure 7:
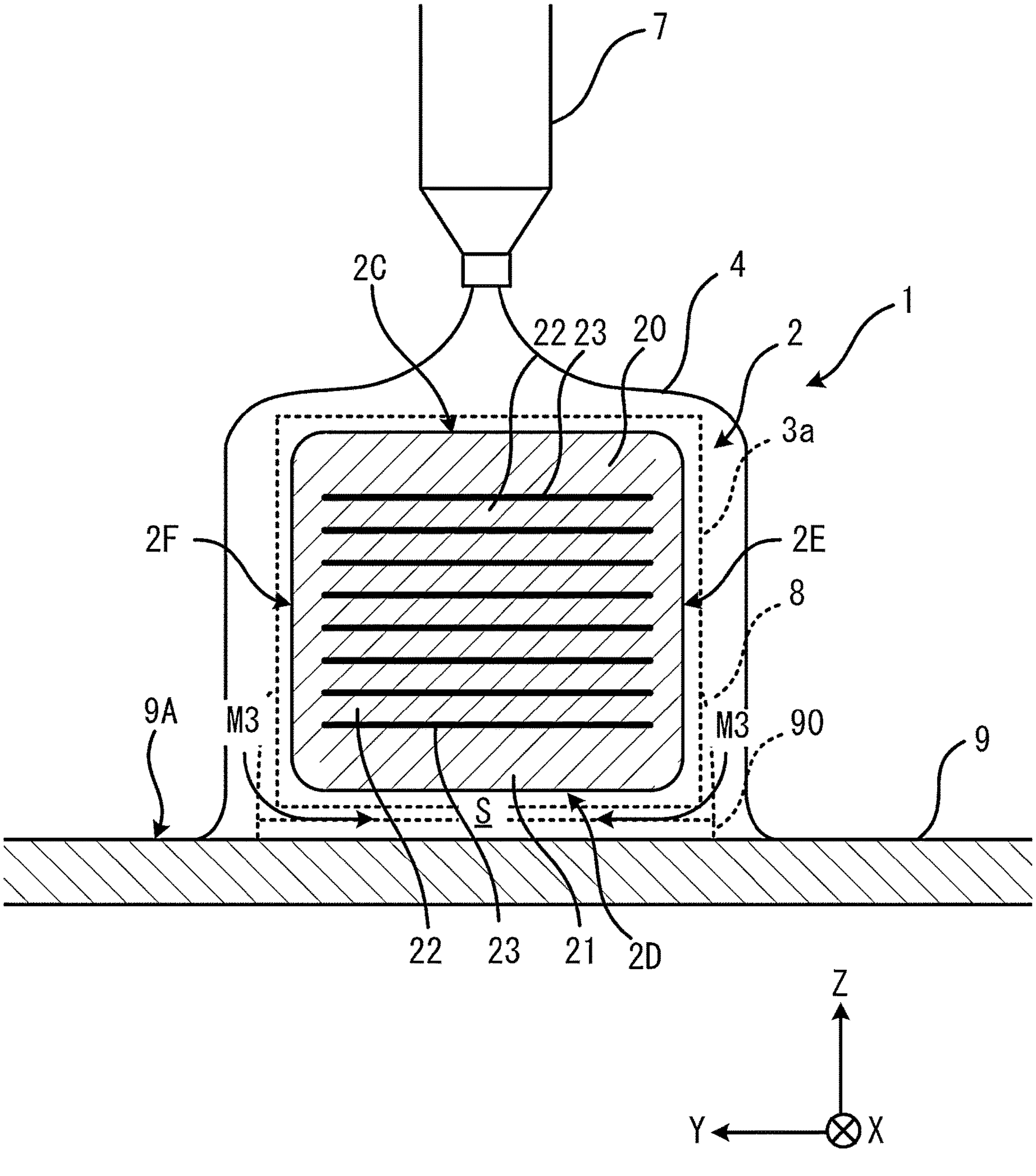
FIG. 7 is a cross-sectional view illustrating an example of a state where a mold resin flows into a gap during a molding process of a multilayer ceramic capacitor.

FIG. 7 is a cross-sectional view illustrating an example of the state where the mold resin 4 flows into the gap S during the molding process of the multilayer ceramic capacitor 1. In FIG. 7, the same reference numerals are used for the components common to FIG. 5, and their explanations are omitted.

After the mold resin 4 flows along both of the side surfaces 2E and 2F as illustrated in FIG. 5, the mold resin flows into the gap S along the lower surface 2D of the multilayer chip 2 as illustrated by reference numeral M3. At this time, as described above, the pressure of the flowing of the mold resin 4 is large, and the surface roughness Ra of the lower surface 2D is smaller than the surface roughness Ra of both of the side surfaces 2E and 2F, so that the mold resin 4 easily spreads wet into the gap S. As a result, voids are less likely to occur in the mold resin 4 in the gap S, and the reliability of the mold can be improved.

Figure 8:
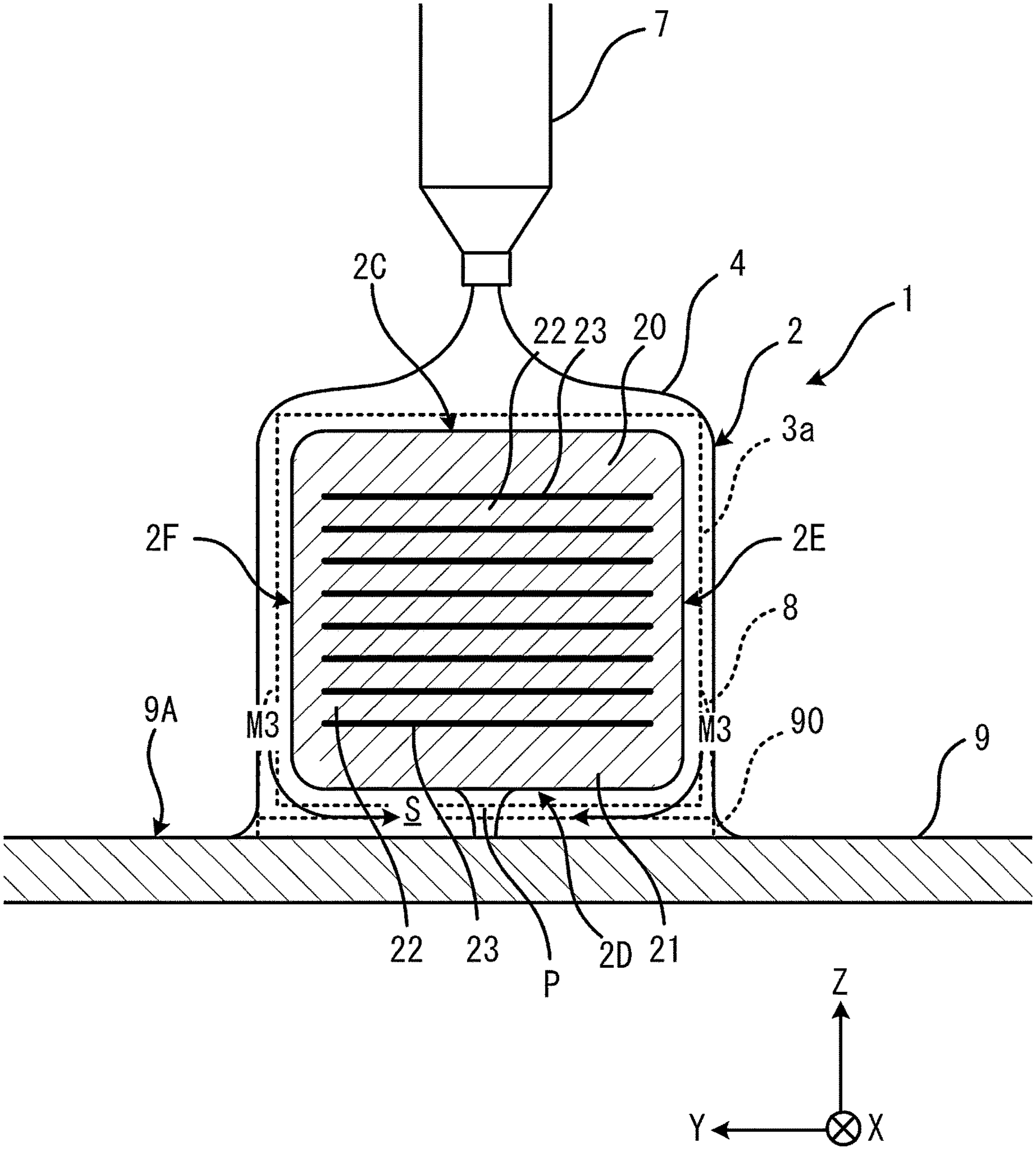
FIG. 8 is a cross-sectional view illustrating another example of a state where a mold resin flows into a gap during a molding process of a multilayer ceramic capacitor.

FIG. 8 is a cross-sectional view illustrating another example of the state where the mold resin 4 flows into the gap S during the molding process of the multilayer ceramic capacitor 1. In FIG. 8, components common to FIG. 6 are given the same reference numerals, and their description will be omitted.

In this example, the case where the mold resin 4 illustrated in FIG. 6 flows into the gap S is taken as an example. Unlike the example of FIG. 7, the surface roughness Ra of the lower surface 2D of the multilayer chip 2 is set to the same value as the surface roughness Ra of each of the side surfaces 2E and 2F. In other words, the surface roughness Ra of the lower surface 2D is larger than that in the example of FIG. 7.

As described above, the pressure at which the mold resin 4 flows is small, and the surface roughness Ra of the lower surface 2D is large, so that the mold resin 4 does not easily wet and spread into the gap S. For this reason, voids P are easily generated in the mold resin 4 in the gap S, which may reduce the reliability of the mold.

By forming the multilayer chip 2 so that the surface roughness Ra of the lower surface 2D is smaller than the surface roughness Ra of the side surfaces 2E and 2F, the mold resin 4 can easily flow into the gap S, and the occurrence of the voids P in the mold resin 4 in the gap S is suppressed. This improves the reliability of the mold in the multilayer ceramic capacitor 1.

In this example, the surface roughness Ra of the lower surface 2D is smaller than the surface roughness Ra of both of the side surfaces 2E and 2F, but the surface roughness Ra of the lower surface 2D may be smaller than the surface roughness Ra of at least one of the side surfaces 2E and 2F. In this case, the flow into the gap S from at least one of the side surfaces 2E and 2F is facilitated, and the occurrence of the voids P in the mold resin 4 can be suppressed.

For example, when the circuit board 9 is bent, the shorter type multilayer ceramic capacitor 1 is more likely to generate large stress in the bending direction than the taller type multilayer ceramic capacitor 1, but the stress is alleviated by sufficiently filling the gap S with the mold resin 4 as described above, and therefore, for example, the occurrence of cracks can be suppressed. Furthermore, the taller type multilayer ceramic capacitor 1 has a larger number of layers than the shorter type multilayer ceramic capacitor 1, and generates more heat. However, by sufficiently filling the gaps S with the mold resin 4 as described above, heat dissipation is improved, and temperature rise can be suppressed.

The greater the difference in surface roughness Ra between the lower surface 2D and the side surfaces 2E and 2F is, the more stable the suppression of voids is. For this reason, it is preferable that the difference in surface roughness Ra is, for example, 0.025 (μm) or more.

The smaller the difference in surface roughness Ra between the lower surface 2D and the side surfaces 2E and 2F is, the smaller the difference in appearance between the lower surface 2D and the side surfaces 2E and 2F is, and this makes it easier to identify defects such as chipping of the ridges of the multilayer ceramic capacitor 1 during optical appearance inspection. For this reason, it is preferable that the difference in surface roughness Ra is, for example, 0.151 (μm) or less.

The larger the surface roughness Ra of the lower surface 2D is, the larger the surface area of the lower surface 2D is, and therefore the stronger the adhesion of the mold resin to the lower surface 2D is. For this reason, it is preferable that the surface roughness of the lower surface 2D is, for example, 0.041 (μm) or more.

The smaller the surface roughness Ra of the lower surface 2D is, the more stably it is to suppress voids. For this reason, it is preferable that the surface roughness of the lower surface 2D is, for example, 0.065 (μm) or less.

The larger the surface roughness Ra of the side surfaces 2E and 2F is, the more the thickness d1 of the mold resin 4 can be increased. For this reason, it is preferable that the surface roughness of the side surfaces 2E and 2F is, for example, 0.090 (μm) or more.

The smaller the surface roughness Ra of the side surfaces 2E and 2F is, the more crack defects can be suppressed. For this reason, it is preferable that the surface roughness Ra of the side surfaces 2E and 2F is, for example, 0.192 (μm) or less. The numerical ranges of the surface roughness Ra of each surface described above are merely examples, and are not intended to be limiting.

(Manufacturing method of multilayer ceramic capacitor)

Figure 9:
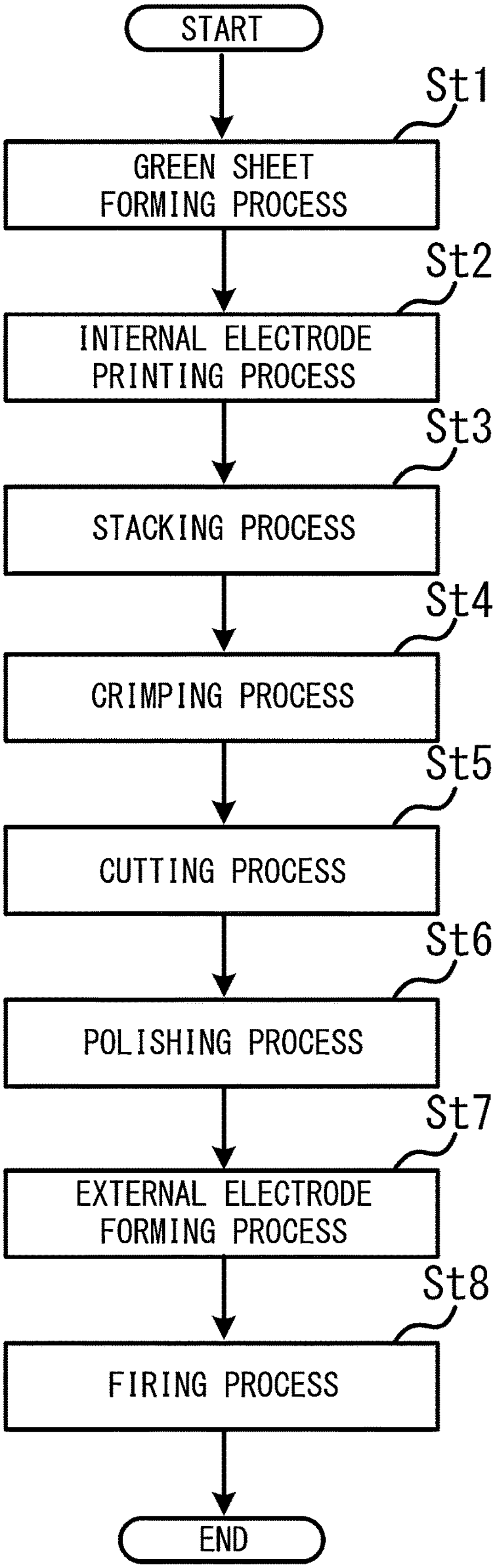
FIG. 9 is a flow chart illustrating an example of a manufacturing process for a multilayer ceramic capacitor.

FIG. 9 is a flow chart illustrating an example of a manufacturing process for the multilayer ceramic capacitor 1. This manufacturing process is an example of a manufacturing method for a multilayer ceramic electronic device.

(Green sheet forming process) First, the green sheet forming process St1 is carried out. In this process, a dielectric material obtained by adding various additive compounds (such as sintering aids) to ceramic powder is wet mixed with a binder such as polyvinyl butyral (PVB) resin, an organic solvent such as ethanol or toluene, and a plasticizer. The resulting slurry is used to coat a dielectric green sheet on a base material, for example, by a die coater method or a doctor blade method, and then dried. The base material is, for example, a PET (polyethylene terephthalate) film.

Additive compounds for the ceramic powder include oxides of Mg (magnesium), Mn (manganese), V (vanadium), Cr (chromium), rare earth elements (Y (yttrium), Sm (samarium), Eu (europium), Gd (gadolinium), Tb (terbium), Dy (dysprosium), Ho (holmium), Er (erbium), Tm (thulium) or Yb (ytterbium)), as well as oxides or glass of Co (cobalt), Ni, Li (lithium), B (boron), Na (sodium), K (potassium) or Si (silicon).

(Internal electrode printing process) Next, the internal electrode printing process St2 is carried out. In this process, a metal conductive paste for forming an internal electrode containing an organic binder is printed by gravure printing on the dielectric green sheet on the base material, so that a plurality of internal electrode patterns corresponding to the internal electrode layers 23 are formed at a distance from each other. Ceramic particles are added to the metal conductive paste as a co-material. The main component of the ceramic particles is not particularly limited, but is preferably the same as the main component ceramic of the dielectric layer 22.

(Stacking process) Next, the stacking process St3 is carried out. In this process, a multilayer sheet is formed by stacking the dielectric green sheets on which the internal electrode pattern that will become the internal electrode layer 23 is printed. Dielectric green sheets corresponding to the cover layers 20 and 21 are stacked on both end surfaces in the stacking direction of the multilayer sheet.

(Crimping process) Next, the crimping process St4 is carried out. This process is an example of a process in which the plurality of green sheets each having the internal electrode pattern formed on its surface are stacked and pressed in the stacking direction with a pressing member to be compressed. In this process, the multilayer sheet is pressurized to compress the plurality of dielectric green sheets. The crimping means may be, for example, a hydrostatic press, but is not limited thereto.

(Cutting process) Next, cutting process St5 is carried out. This process is an example of a process in which the multilayer sheet after crimping is cut along the stacking direction with a blade so as to divide it into a plurality of the multilayer chips 2. In this process, a plurality of the multilayer chips 2 are obtained by cutting the multilayer sheet along a predetermined cut line in the stacking direction.

(Polishing process) Next, polishing process St6 is carried out. In this process, the multilayer chip 2 is polished by a method such as barrel polishing. As a result, the corners of the multilayer chip 2 are rounded.

(External electrode forming process) Next, external electrode formation process St7 is carried out. This process is an example of a process in which a pair of external electrodes 3*a* and 3*b* are formed that cover the pair of end surfaces 2A and 2B of the multilayer chip 2 and are alternately connected to the internal electrode layer 23 along the stacking direction. In this process, a conductive paste containing, for example, metal powder, glass frit, binder, and solvent is applied to each of the end surfaces 2A and 2B, the upper surface 2C, the lower surface 2D, and each of the side surfaces 2E and 2F of the multilayer chip 2. After the conductive paste is applied, it is dried to form the external electrodes 3*a* and 3*b*. The binder and the solvent are evaporated by baking. Examples of the method for applying the conductive paste include a sputtering method and a dipping method.

(Firing process) Next, the firing process St8 is carried out. In this process, the multilayer chip 2 on which the external electrodes 3*a* and 3*b* are formed is subjected to a binder removal process in an $N_2$ atmosphere at 250 to 500° C., and then fired in a reducing atmosphere at 1300 to 1400° C. for about 1 hour, thereby sintering each particle in the multilayer chip 2. In this way, the manufacturing process of the multilayer ceramic capacitor 1 is carried out. After the firing process, metal coatings such as Cu, Ni, Sn and the like may be applied to the external electrodes 3*a* and 3*b* by plating. Furthermore, the external electrode formation process St7 may be performed after the firing process St8.

For example, in the crimping process St4, the surface roughness Ra of the pressing member pressing the multilayer sheet is set so that the surface roughness Ra of the lower surface 2D of the multilayer chip 2 is smaller than the surface roughness Ra of the side surfaces 2E and 2F.

Figure 10:
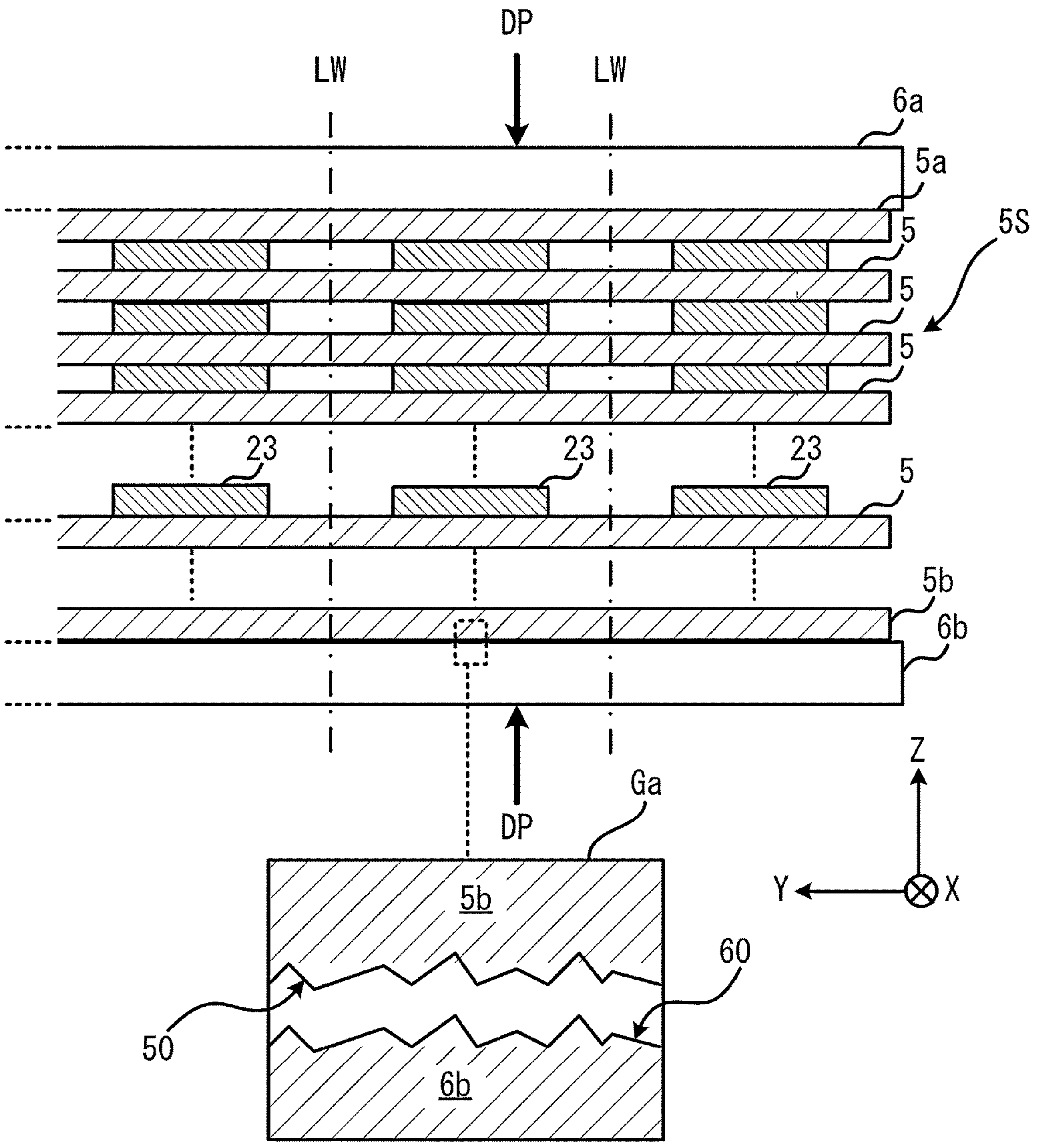
FIG. 10 is a side view of a multilayer sheet of an example of a crimping step.

FIG. 10 is a side view of a multilayer sheet 5S of an example of the crimping step St4. The multilayer sheet 5S includes the plurality of dielectric green sheets 5 on whose surface the internal electrode layer 23 is formed, and dielectric green sheets 5*a* and 5*b* corresponding to the cover layers 20 and 21. The plurality of dielectric green sheets 5 are stacked so as to be adjacent to each other in the stacking direction, and the dielectric green sheets 5*a* and 5*b* are stacked on the top and bottom dielectric green sheets 5 in the stacking direction, respectively. The multilayer sheet 5S is cut into the individual multilayer chips 2 along the cutting lines LW in the cutting step St5.

The multilayer sheet 5S is crimped by being sandwiched between a pair of pressing members 6*a* and 6*b* from above and below in the stacking direction. The pressing members 6*a* and 6*b* are, for example, metal plate-shaped members, and as indicated by the symbol DP, press the multilayer sheet 5S from above and below in the stacking direction, for example, by hydrostatic pressure.

The symbol Ga indicates an enlarged view of a surface 60 of the lower pressing member 6*b* and a lower surface 50 of the dielectric green sheet 5*b*, which come into contact with each other in the crimping step St4. The surface 60 of the pressing member 6*b* has irregularities according to the design value of the surface roughness Ra of the lower surface 2D of the multilayer chip 2. The irregularities of the pressing member 6*b* are transferred to the lower surface 50 of the dielectric green sheet 5*b* by the pressing member 6*b* pressing the dielectric green sheet 5*b* in the crimping step St4. As a result, the surface roughness Ra of the lower surface 2D of the multilayer chip 2, which corresponds to the lower surface 50, becomes a desired value smaller than the surface roughness Ra of the side surfaces 2E and 2F.

In this way, the surface roughness Ra of the surface of the pressing member 6*b* that comes into contact with the lower surface 2D is set so that the surface roughness Ra of the lower surface 2D is smaller than the surface roughness Ra of the side surfaces 2E and 2F, so that the surface roughness Ra of the lower surface 2D can be easily adjusted to a desired value. After confirming that the surface roughness Ra of the dielectric green sheet 5*b* has been adjusted to the desired value, the next cutting step St5 is carried out.

In this example, adjustment of the surface roughness Ra of the lower surface 2D of the multilayer chip 2 has been described, but the surface roughness Ra of the upper surface 2C can also be adjusted by the same means as above. In this case, the surface roughness Ra of the pressing member 6*a* that contacts the upper dielectric green sheet 5*a* is set according to the desired value of the upper surface 2C. As a result, in the crimping step St4, the irregularities of the pressing member 6*a* is transferred to the upper surface of the dielectric green sheet 5*a*, and the surface roughness Ra of the upper surface 2C becomes smaller than the surface roughness Ra of the side surfaces 2E and 2F.

In addition, the adjustment of the surface roughness Ra of the lower surface 2D is not limited to the above means. For example, in the cutting step St5, irregularities may be formed on the cutting edge of the blade so that the surface roughness Ra of the lower surface 2D of the multilayer chip 2 is smaller than the surface roughness Ra of the side surfaces 2E and 2F.

Figure 11:
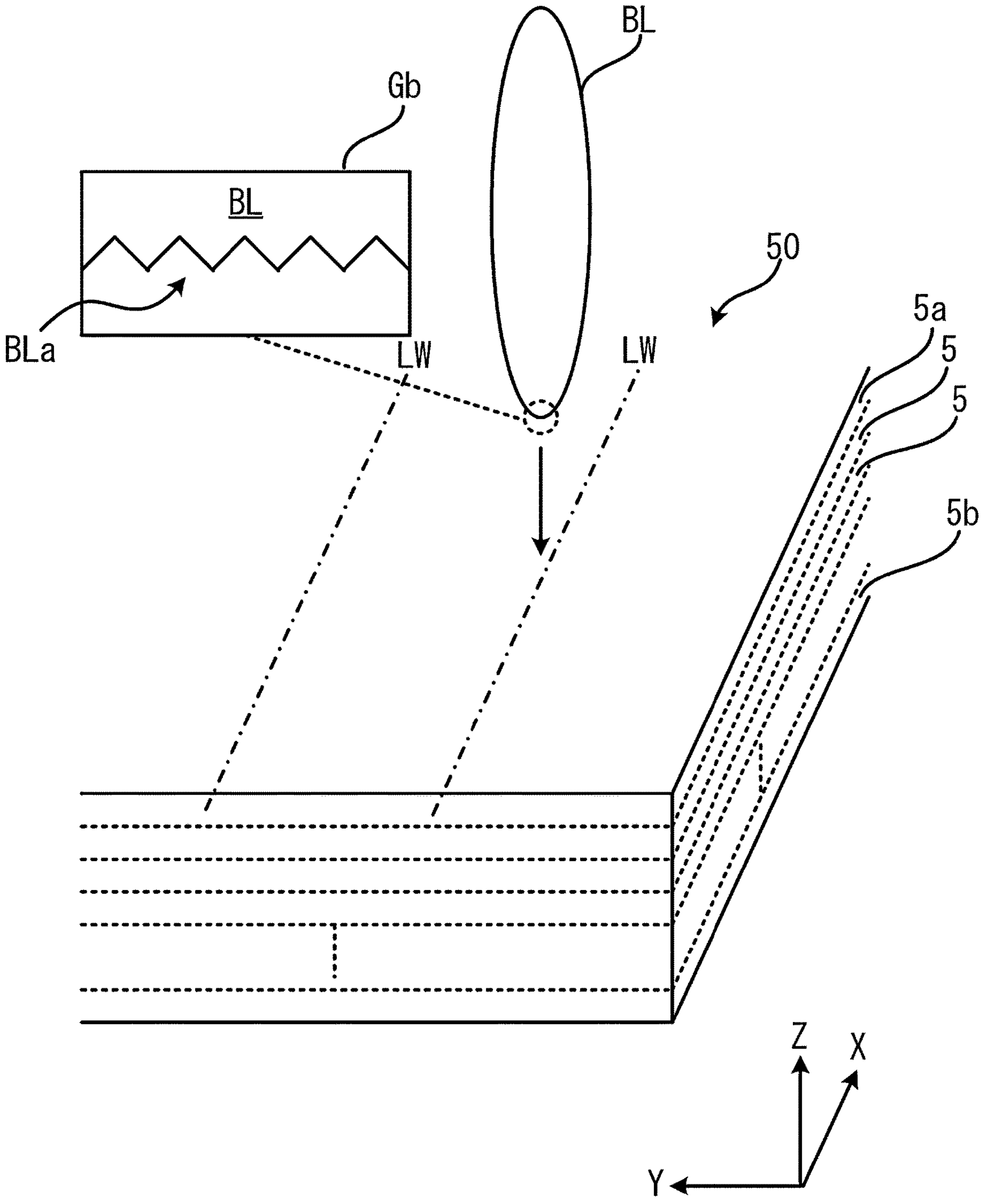
FIG. 11 is a perspective view of a multilayer sheet of an example of a cutting step.

FIG. 11 is a perspective view of the multilayer sheet 5S of an example of the cutting step St5. The multilayer sheet 5S is cut in the stacking direction along the cutting line LW by a rotating disk-shaped blade BL. This results in the plurality of multilayer chips 2.

The symbol Gb indicates an enlarged part of the cutting edge BLa of the blade BL. The cutting edge BLa has saw-like irregularities formed thereon, as an example. The uneven shape of the cutting edge BLa is determined according to the desired value of the surface roughness Ra of the side surfaces 2E and 2F of the multilayer chip 2. For example, the height and pitch of the irregularities of the cutting edge BLa are determined so as to roughen the cut surfaces of the multilayer sheet 5S corresponding to the side surfaces 2E and 2F. As a result, the surface roughness Ra of the lower surface 2D of the multilayer chip 2 becomes smaller than the surface roughness Ra of the side surfaces 2E and 2F.

In this way, the cutting edge BLa of the blade BL is uneven so that the surface roughness Ra of the lower surface 2D is smaller than the surface roughness Ra of the side surfaces 2E and 2F, so that the surface roughness Ra of the side surfaces 2E and 2F can be easily adjusted to a desired value. After confirming that the surface roughness Ra of the cut surface of the multilayer sheet 5S has been adjusted to a desired value, the next polishing step St6 is carried out.

In this example, an example of adjusting the surface roughness Ra of the side surfaces 2E and 2F is given, but it is also possible to adjust only the surface roughness Ra of one of the side surfaces 2E and 2F. Also, in this example, an example of adjusting the surface roughness Ra of the side surfaces 2E and 2F to be larger than the surface roughness Ra of the lower surface 2D is given, but it is also possible to adjust the surface roughness Ra of the side surfaces 2E and 2F to be larger than both the surface roughness Ra of the lower surface 2D and the surface roughness Ra of the upper surface 2C.

The surface roughness of the upper surface 2C, the lower surface 2D, and the side surfaces 2E and 2F of the multilayer chip 2, and the difference in surface roughness Ra between the upper surface 2C and the side surfaces 2E and 2F, are as described above.

EXAMPLE

Next, the evaluation results of the multilayer ceramic capacitor 1 of the example will be described.

side surfaces 2E and 2F was set to 0.041 (μm) and 0.192 (μm), respectively. In the multilayer ceramic capacitor of Example 4, the surface roughness Ra of the lower surface 2D and the side surfaces 2E and 2F was set to 0.054 (μm) and 0.116 (μm), respectively. In the multilayer ceramic capacitor of Example 5, the surface roughness Ra of the lower surface 2D and the side surfaces 2E and 2F was set to 0.062 (μm) and 0.091 (μm), respectively. In the multilayer ceramic capacitor of Example 6, the surface roughness Ra of the lower surface 2D and the side surfaces 2E and 2F was set to 0.048 (μm) and 0.127 (μm), respectively.

As a result, the differences ΔRa between the surface roughness Ra of the lower surface 2D and the surface roughness Ra of the side surfaces 2E and 2F in Examples 1 to 6 were 0.025 (μm), 0.056 (μm), 0.151 (μm), 0.062 (μm), 0.029 (μm), and 0.079 (μm), respectively. In this way, for the multilayer ceramic capacitors of Examples 1 to 3, the surface roughness Ra of the lower surface 2D was set to be smaller than the surface roughness Ra of the side surfaces 2E and 2F.

On the other hand, in the multilayer ceramic capacitor of Comparative Example 1, the surface roughness Ra of the lower surface 2D and the side surfaces 2E and 2F was set to 0.089 (μm) and 0.068 (μm), respectively. In the multilayer ceramic capacitor of Comparative Example 2, the surface roughness Ra of the lower surface 2D and the side surfaces

TABLE 1

| | SURFACE ROUGHNESS Ra (μm) | | DIFFERENCE OF SURFACE ROUGHNESS | PRESENCE OR | |
|---|---|---|---|---|---|
| | LOWER SURFACE | SIDE SURFACE | ΔRa (μm) | ABSENCE OF VOID | EVALUATION RESULT |
| EXAMPLE 1 | 0.065 | 0.090 | 0.025 | ABSENCE | OK |
| EXAMPLE 2 | 0.073 | 0.129 | 0.056 | ABSENCE | OK |
| EXAMPLE 3 | 0.041 | 0.192 | 0.151 | ABSENCE | OK |
| EXAMPLE 4 | 0.054 | 0.116 | 0.062 | ABSENCE | OK |
| EXAMPLE 5 | 0.062 | 0.091 | 0.029 | ABSENCE | OK |
| EXAMPLE 6 | 0.048 | 0.127 | 0.079 | ABSENCE | OK |
| COMPARATIVE EXAMPLE 1 | 0.089 | 0.068 | −0.021 | PRESENCE | NG |
| COPARATIVE EXAMPLE 2 | 0.075 | 0.061 | −0.014 | PRESENCE | NG |

Table 1 shows the evaluation results of the multilayer ceramic capacitors of Examples 1 to 6 and examples 1 and 2 for comparison (hereinafter referred to as Comparative Examples 1 and 2). The multilayer ceramic capacitors of Examples 1 to 6 and Comparative Examples 1 and 2 were fabricated according to the above manufacturing process and were evaluated. Each multilayer ceramic capacitor was a taller type. The size of each multilayer ceramic capacitor was 0.6 (mm) in length, 0.3 (mm) in width, and 0.4 (mm) in height, and the rated voltage of each multilayer ceramic capacitor was 6.3 (V).

The surface roughness Ra of each multilayer ceramic capacitor was adjusted in the above crimping process St4. In the multilayer ceramic capacitor of Example 1, the surface roughness Ra of the lower surface 2D and the side surfaces 2E and 2F was set to 0.065 (μm) and 0.09 (μm), respectively. In the multilayer ceramic capacitor of Example 2, the surface roughness Ra of the lower surface 2D and the side surfaces 2E and 2F was set to 0.073 (μm) and 0.129 (μm), respectively. In the multilayer ceramic capacitor of Example 3, the surface roughness Ra of the lower surface 2D and the

2E and 2F was set to 0.075 (μm) and 0.061 (μm), respectively. As a result, the difference ΔRa between the surface roughness Ra of the lower surface 2D and the surface roughness Ra of the side surfaces 2E and 2F in Comparative Examples 1 and 2 was −0.021 (μm) and −0.014, respectively. In this way, in the multilayer ceramic capacitor of the comparative example, the surface roughness Ra of the lower surface 2D was set to be greater than the surface roughness Ra of the side surfaces 2E and 2F, in contrast to Examples 1 to 6.

The multilayer ceramic capacitors of Examples 1 to 6 and Comparative Examples 1 and 2 were mounted on the circuit board 9 by a reflow process so that the lower surface 2D faced the board surface 9S. After mounting, mold resin was poured into the multilayer ceramic capacitor from a dispenser above the circuit board 9 to cover its entire outer surface. The viscosity of the mold resin at this time was set to 6700 (Pa·s). The circuit board 9 was then heated for 8 to 10 minutes in a batch furnace at 130 to 150 (° C.) to harden the mold resin. After the mold resin hardened, the presence or absence of voids in the mold resin filled in the gap between the lower surface 2D and the board surface 9S was confirmed by viewing the A-A cross section in FIG. 1.

The "Presence or Absence of Voids" in Table 1 indicates the confirmation results. There were no voids in the multilayer ceramic capacitors of Examples 1 to 6. For this reason, the judgment results for Examples 1 to 3 were set to "OK". This is because in Examples 1 to 6, the surface roughness Ra of the lower surface 2D is smaller than the surface roughness Ra of each of the side surfaces 2E and 2F, so that the mold resin easily flows from the side surfaces 2E and 2F along the lower surface 2D into the gaps, as described above.

In contrast, voids were confirmed in the multilayer ceramic capacitors of Comparative Examples 1 and 2. For this reason, the comparative examples were judged to be "NG". This is because in Examples 1 to 6, the surface roughness Ra of the lower surface 2D is larger than the surface roughness Ra of each of the side surfaces 2E and 2F, so that the mold resin does not easily flow from the side surfaces 2E and 2F along the lower surface 2D into the gaps, as described above.

In this way, the case where the difference in surface roughness Ra between the lower surface 2D and the side surfaces 2E and 2F is 0.025 (μm) or more, or 0.151 (μm) or less is preferable, because the mold resin 4 flows into the voids favorably. Furthermore, it is preferable that the surface roughness Ra of the lower surface 2D is 0.041 to 0.065 (μm) and the surface roughness Ra of the side surfaces 2E and 2F is 0.090 to 0.192 (μm) because this allows the mold resin to flow into the voids favorably.

Although the embodiments of the present invention have been described in detail, it is to be understood that the various change, substitutions, and alterations could be made hereto without departing from the spirit and scope of the invention.

What is claimed is:

1. A multilayer ceramic electronic device comprising:

a multilayer structure having a substantially rectangular parallelepiped shape in which each of a plurality of internal electrode layers and each of a plurality of dielectric layers are alternately stacked; and a pair of external electrodes that respectively cover a pair of facing end surfaces of the multilayer structure, and are alternately connected to the plurality of internal electrode layers along a stacking direction of the multilayer structure, wherein, among four surfaces of the multilayer structure excluding the pair of end surfaces, a surface roughness of at least one of a pair of first surfaces that face each other in the stacking direction is smaller than a surface roughness of at least one of a pair of second surfaces that face each other in an orthogonal direction approximately orthogonal to a facing direction in which the pair of end surfaces face each other and the stacking directions, and at least one of the pair of first surfaces has a surface roughness of 0.041 μm or more.

2. The multilayer ceramic electronic device as claimed in claim 1, wherein a length of the stacking direction of the multilayer structure is shorter than a length of the facing direction and the orthogonal direction of the multilayer structure.

3. The multilayer ceramic electronic device as claimed in claim 1, wherein a length of the stacking direction of the multilayer structure is larger than a length of the orthogonal direction of the multilayer structure.

4. The multilayer ceramic electronic device as claimed in claim 1, wherein a difference between a surface roughness of at least one of the pair of first surfaces and a surface roughness of the pair of second surfaces is 0.151 μm or less.

5. The multilayer ceramic electronic device as claimed in claim 1, wherein a difference between a surface roughness of at least one of the pair of first surfaces and a surface roughness of the pair of second surfaces is 0.025 μm or more.

6. The multilayer ceramic electronic device as claimed in claim 1, wherein at least one of the pair of first surfaces has a surface roughness of 0.041 to 0.065 μm, and wherein each of the pair of second surfaces has a surface roughness of 0.090 to 0.192 μm.

7. The multilayer ceramic electronic device as claimed in claim 1, wherein the multilayer ceramic electronic device is a multilayer ceramic capacitor.

8. A manufacturing method of a multilayer ceramic electronic device comprising:

stacking a plurality of green sheets, each having an internal electrode layer formed on a surface thereof;

crimping the plurality of green sheets in a stacking direction with a pressing member;

after the crimping, cutting the plurality of green sheets along the stacking direction with a blade so as to divide the plurality of green sheets into a plurality of multilayer structures having a substantially rectangular parallelepiped shape; and forming a pair of external electrodes so as to cover a pair of facing end surfaces of the multilayer structure and so as to be alternately connected to the internal electrode layers along the stacking direction, wherein, in the crimping, among four surfaces of the multilayer structure excluding the pair of end surfaces, a surface roughness of a surface of the pressing member contacting at least one of a pair of first surfaces facing each other in the stacking direction is set so that a surface roughness of at least one of the pair of first surfaces is smaller than a surface roughness of at least one of a pair of second surfaces adjacent to the pair of first surfaces, and at least one of the pair of first surfaces has a surface roughness of 0.041 μm or more.

9. The method as claimed in claim 8, wherein a difference between the surface roughness of at least one of the pair of first surfaces and the surface roughness of the pair of second surfaces is set to 0.151 μm or less.

10. The method as claimed in claim 8, wherein a difference between the surface roughness of at least one of the pair of first surfaces and the surface roughness of the pair of second surfaces is set to be 0.025 μm or more.

11. The method as claimed in claim 8, wherein at least one of the pair of first surfaces has a surface roughness of 0.041 to 0.065 μm, and wherein each of the pair of second surfaces has a surface roughness of 0.090 to 0.192 μm.

12. A manufacturing method of a multilayer ceramic electronic device comprising:

stacking a plurality of green sheets, each having an internal electrode layer formed on a surface thereof;

crimping the plurality of green sheets in a stacking direction with a pressing member;

after the crimping, cutting the plurality of green sheets along the stacking direction with a blade so as to divide the plurality of green sheets into a plurality of multilayer structures having a substantially rectangular parallelepiped shape; and forming a pair of external electrodes so as to cover a pair of facing end surfaces of the multilayer structure and so as to be alternately connected to the internal electrode layers along the stacking direction, wherein, in the cutting, among four surfaces of the multilayer structure excluding the pair of end surfaces, a cutting edge of the blade is formed with irregularities so that a surface roughness of at least one of a pair of first surfaces facing each other in the stacking direction is smaller than a surface roughness of at least one of a pair of second surfaces adjacent to the pair of first surfaces, and at least one of the pair of first surfaces has a surface roughness of 0.041 μm or more.

13. The method as claimed in claim 12, wherein a difference between the surface roughness of at least one of the pair of first surfaces and the surface roughness of the pair of second surfaces is set to 0.151 μm or less.

14. The method as claimed in claim 12, wherein a difference between the surface roughness of at least one of the pair of first surfaces and the surface roughness of the pair of second surfaces is set to be 0.025 μm or more.

15. The method as claimed in claim 12, wherein at least one of the pair of first surfaces has a surface roughness of 0.041 to 0.065 μm, and wherein each of the pair of second surfaces has a surface roughness of 0.090 to 0.192 μm.

16. A circuit board comprising:

a multilayer ceramic electronic device that is covered with a mold material and is mounted on the circuit board, wherein the multilayer ceramic capacitor comprises:

a multilayer structure having a substantially rectangular parallelepiped shape in which each of a plurality of internal electrode layers and each of a plurality of dielectric layers are alternately stacked; and a pair of external electrodes that respectively cover a pair of facing end surfaces of the multilayer structure, and are alternately connected to the plurality of internal electrode layers along a stacking direction of the multilayer structure, wherein, among four surfaces of the multilayer structure excluding the pair of end surfaces, a surface roughness of a first surface of the multilayer structure facing the circuit board is smaller than a surface roughness of at least one of a pair of second surfaces adjacent to the first surface, and the first surface has a surface roughness of 0.041 μm or more.

* * * * *